US012813237B2

(12) United States Patent
Iwashita

(10) Patent No.: US 12,813,237 B2
(45) Date of Patent: Nov. 24, 2026

(54) SUBSTRATE LIQUID PROCESSING METHOD AND SUBSTATE LIQUID PROCESSING APPARATUS

(71) Applicant: Tokyo Electron Limited, Tokyo (JP)

(72) Inventor: Mitsuaki Iwashita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 557 days.

(21) Appl. No.: 17/754,081

(22) PCT Filed: Sep. 14, 2020

(86) PCT No.: PCT/JP2020/034626
§ 371 (c)(1),
(2) Date: Mar. 23, 2022

(87) PCT Pub. No.: WO2021/060037
PCT Pub. Date: Apr. 1, 2021

(65) Prior Publication Data

US 2022/0344205 A1 Oct. 27, 2022

(30) Foreign Application Priority Data

Sep. 25, 2019 (JP) ................................ 2019-174591

(51) Int. Cl.
*H01L 21/768* (2006.01)
*C23C 18/16* (2006.01)
(Continued)

(52) U.S. Cl.
CPC ....... *H10W 20/057* (2026.01); *C23C 18/1692* (2013.01); *C23C 18/18* (2013.01);
(Continued)

(58) Field of Classification Search
CPC ............. H01L 21/76879; H01L 21/288; H01L 23/53238; H01L 21/76843; H01L 21/6723;
(Continued)

(56) References Cited

U.S. PATENT DOCUMENTS 6,472,023 B1 * 10/2002 Wu ......................... C23C 18/42 427/430.1
9,343,356 B2 * 5/2016 Kuo .................... H10W 20/033
(Continued)

FOREIGN PATENT DOCUMENTS

CN 103996652 A * 8/2014 ....... H01L 21/76829
JP 2001-015517 A 1/2001
(Continued)

OTHER PUBLICATIONS

Muhlbacher: "Cu diffusion in single-crystal and polycrystalline TiN barrier layers: A high-resolution experimental study supported by first-principles calculations", J. Appl. Phys. Aug. 28, 2015; 118 (8): 085307, https://doi.org/10.1063/1.4929446 (Year: 2015).*
(Continued)

*Primary Examiner* — Kretelia Graham
*Assistant Examiner* — Moataz Khalifa
(74) *Attorney, Agent, or Firm* — Chrisman Gallo Tochtrop LLC

(57) ABSTRACT

A substrate having a recess, a diffusion barrier layer defining the recess, and a wiring exposed at a bottom of the recess is prepared. A metal ion, having a concentration not causing precipitation of a metal even when an electroless plating liquid comes into contact therewith, is attached to the diffusion barrier layer. The metal is precipitated in the recess by supplying the electroless plating liquid into the recess in a state that the metal ion is attached to the diffusion barrier layer.

6 Claims, 6 Drawing Sheets

(51) Int. Cl.
*C23C 18/18* (2006.01)
*C23C 18/31* (2006.01)
*H10P 14/46* (2026.01)
*H10W 20/00* (2026.01)

(52) U.S. Cl.
CPC .............. *C23C 18/31* (2013.01); *H10P 14/46* (2026.01); *H10W 20/056* (2026.01)

(58) Field of Classification Search
CPC ..... C23C 18/18; C23C 18/31; C23C 18/1879; C23C 18/38; C23C 18/1628
See application file for complete search history.

(56) References Cited

U.S. PATENT DOCUMENTS

| | | | | |
|---|---|---|---|---|
| 9,728,485 | B1 * | 8/2017 | Lee | H01L 23/3736 |
| 9,837,312 | B1 * | 12/2017 | Tan | C23C 18/1628 |
| 2004/0087141 | A1 * | 5/2004 | Ramanathan | C23C 18/166 257/E21.585 |
| 2005/0136654 | A1 * | 6/2005 | Cheng | C23C 18/1651 257/E21.174 |
| 2006/0254504 | A1 * | 11/2006 | Dai | H01L 21/288 117/84 |
| 2008/0128907 | A1 * | 6/2008 | Yang | H10W 20/033 257/E23.141 |
| 2016/0307759 | A1 | 10/2016 | Mizutani et al. | |
| 2018/0211872 | A1 | 7/2018 | Wu et al. | |
| 2019/0274221 | A1 * | 9/2019 | Bahl | H05K 1/092 |

FOREIGN PATENT DOCUMENTS

| | | | | | |
|---|---|---|---|---|---|
| JP | 2002-110784 | A | | 4/2002 | |
| JP | 2006-513325 | A | | 4/2006 | |
| JP | 2006-210508 | A | | 8/2006 | |
| JP | 2010-503204 | A | | 1/2010 | |
| JP | 2014-099627 | A | | 5/2014 | |
| JP | 2014-122391 | A | | 7/2014 | |
| TW | 201710549 | A | * | 3/2017 | C23C 18/1608 |
| TW | 201842219 | A | | 12/2018 | |
| WO | WO-2019114011 | A1 | * | 6/2019 | C23C 18/31 |

OTHER PUBLICATIONS

Muhlbacher (Year: 2015).*
Wang et al—Translation (Year: 2019).*
International Search Report for PCT/JP2020/034626 dated Dec. 1, 2020.

* cited by examiner

SUBSTRATE LIQUID PROCESSING METHOD AND SUBSTATE LIQUID PROCESSING APPARATUS

CROSS-REFERENCE TO RELATED APPLICATIONS

This Application is a U.S. national phase application under 35 U.S.C. § 371 of PCT Application No. PCT/JP2020/034626 filed on Sep. 14, 2020, which claims the benefit of Japanese Patent Application No. 2019-174591 filed on Sep. 25, 2019, the entire disclosures of which are incorporated herein by reference.

TECHNICAL FIELD

The various aspects and embodiments described herein pertain generally to a substrate liquid processing method and a substrate liquid processing apparatus.

BACKGROUND

With the progress in high densification of wiring in an integrated circuit such as LSI, various wiring forming methods such as a dual damascene method have been proposed. For example, Patent Document 1 discloses a manufacturing method for a semiconductor device in which a cap layer is formed on a metal wiring, a barrier metal layer is formed on an inner wall of a connection hole reaching the metal wiring and on an inner wall of a wiring groove led to the connection hole, and a metal layer is buried in the connection hole and the wiring groove.

In such a wiring forming method, various methods have been proposed as a way to bury the metal wiring in a recess (including the hole and the groove). For example, in the manufacturing method of Patent Document 1, copper is buried in the connection hole and the wiring groove by depositing plating copper after forming a seed layer by a PVD (Physical Vapor Deposition) method. Further, it is also possible to fill the recess with a plating metal by performing an electroless plating processing in the state that the metal wiring is exposed at the bottom of the recess, thereby allowing the plating metal to be gradually deposited from the bottom of the recess toward the top thereof.

Patent Document 1: Japanese Patent Laid-open Publication No. 2006-210508

SUMMARY

In an exemplary embodiment, a substrate liquid processing method includes preparing a substrate having a recess, a diffusion barrier layer defining the recess, and a wiring exposed at a bottom of the recess; attaching, to the diffusion barrier layer, a metal ion having a concentration not causing precipitation of a metal even when an electroless plating liquid comes into contact therewith; and precipitating the metal in the recess by supplying the electroless plating liquid into the recess in a state that the metal ion is attached to the diffusion barrier layer.

DETAILED DESCRIPTION

Figure 1:
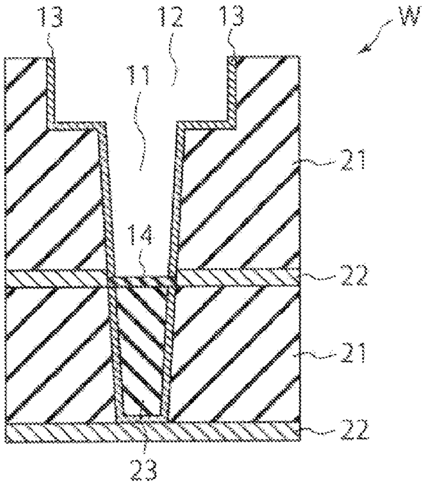
FIG. 1 is a diagram illustrating an example of a part of a cross section of a substrate to describe an example flow of an electroless plating processing.
Figure 2:
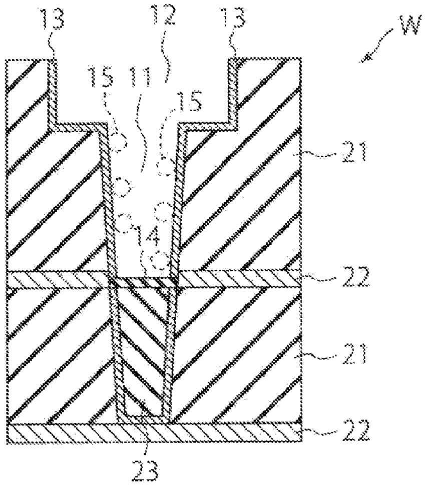
FIG. 2 is a diagram illustrating an example of the part of the cross section of the substrate to describe the example flow of the electroless plating processing.
Figure 3:
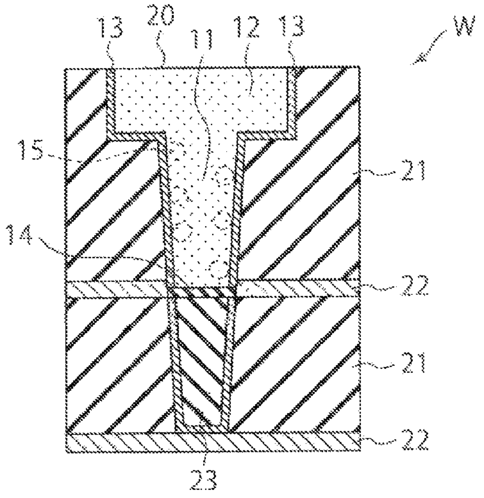
FIG. 3 is a diagram illustrating an example of the part of the cross section of the substrate to describe the example flow of the electroless plating processing.

Hereinafter, examples of a substrate liquid processing apparatus and a substrate liquid processing method will be described with reference to the accompanying drawings.

In the following description, examples of an apparatus and a method for burying a metal (particularly, copper) serving as a via (through wiring) in a via hole (that is, a recess) by an electroless plating processing will be described. However, the substrate liquid processing apparatus and the substrate liquid processing method according to the present disclosure are not limited to the apparatus and the method exemplified below. By way of example, it is possible to apply the apparatus and method according to the present disclosure to bury the metal in a recess (including a hole or a groove) other than the via hole. In addition, the substrate liquid processing apparatus and the substrate liquid processing method according to the present disclosure may also be applied to bury a metal (for example, cobalt (Co), gold (Au), or silver (Ag)) other than the copper in the recess.

FIG. 1 to FIG. 4 are diagrams illustrating an example of a cross section of a part (particularly, a part having a via hole 11) of a substrate W, and show an example flow of an electroless plating processing.

The substrate W has the via hole 11 and a trench 12 formed in an insulating film 21, a diffusion barrier layer 13 provided on the insulating film 21 to define the via hole 11 and the trench 12, and a cap layer (wiring) 14 exposed at a bottom of the via hole 11.

In the shown substrate W, the insulating film 21 is provided on an etching stop layer 22, and this insulating film 21 provided at an upper side and an insulating film 21 provided at a lower side are separated by the etching stop layer 22. In the insulating film 21 provided at the lower side, a first metal wiring 23 made of copper is embedded in a region defined by the diffusion barrier layer 13. A top surface of the first metal wiring 23 is covered with the cap layer 14. The via hole 11 and the trench 12 are located on the opposite side to the first metal wiring 23 with the cap layer 14 therebetween. The via hole 11 and the cap layer 14 are formed through the etching stop layer 22 which is provided between the insulating film 21 at the upper side and the insulating film 21 at the lower side.

Specific materials and methods for forming the substrate W are not particularly limited. Typically, the insulating film 21 may be made of a low dielectric-constant insulating material film (a so-called Low-k film) or silicon dioxide ($SiO_2$). The etching stop layer 22 may be made of silicon carbon nitride (SiCN) or another silicon-based material (for example, silicon nitride (SiN) or silicon carbide (SiC)). The diffusion barrier layer 13 suppresses diffusion of a wiring (copper in the present exemplary embodiment) provided in the via hole 11 and the trench 12 into the insulating film 21, and may be made of tantalum (Ta), tantalum nitride (TaN), titanium (Ti), or titanium nitride (TiN). The cap layer 14 is made of a material that acts as a catalytic nucleus of a plating reaction in the electroless plating processing for burying a metal (via) in the via hole 11. In the present exemplary embodiment in which the copper is buried in the via hole 11, the cap layer 14 may be made of, by way of non-limiting example, cobalt (Co).

In the substrate liquid processing method (especially, the electroless plating processing) of the present exemplary embodiment, the substrate W having the above-described structure is prepared (see FIG. 1). Then, metal ions 15 are attached to the diffusion barrier layer 13 that defines the via hole 11 of the substrate W (see FIG. 2). At this time, the metal ions 15 having a concentration not causing precipitation of copper (metal) even when an electroless plating liquid containing copper ions comes into contact with them are attached to the diffusion barrier layer 13. Here, although the metal ions 15 adhere to the diffusion barrier layer 13 defining the via hole 11, they may adhere to the diffusion barrier layer 13 defining the trench 12.

The metal ions 15 adhering to the diffusion barrier layer 13 have an excellent bonding property for a plating metal to be buried in the via hole 11. In the present exemplary embodiment, the metal ions 15 having an excellent bonding property for the copper to be buried in the via hole 11 are attached to the diffusion barrier layer 13. Typically, the metal ions 15 may include ions of at least one of palladium (Pd), ruthenium (Ru) and platinum (Pt).

The way how to attach the metal ions 15 to the diffusion barrier layer 13 at the "concentration not causing the precipitation of the copper (metal) even when the electroless plating liquid containing the copper ions comes into contact with them" is not particularly limited. By way of example, a liquid (a metal ion-containing liquid) in which the metal ions 15 with a sufficiently low concentration are dispersed may be applied (for example, coated) on an exposed surface of the diffusion barrier layer 13. Further, after the metal ions 15 are applied to the diffusion barrier layer 13, a processing of supplying a rinse liquid (for example, pure water) to the surface of the diffusion barrier layer 13 to which the metal ions 15 are attached may be performed to wash away some of the metal ions 15 adhering to the diffusion barrier layer 13. Furthermore, after the metal ions 15 are applied to the diffusion barrier layer 13, a processing of enhancing the strength of the adhesion of the metal ions 15 to the diffusion barrier layer 13 may be performed. For example, a processing of heating the diffusion barrier layer 13 to which the metal ions 15 are attached in an atmosphere of a low oxygen concentration (for example, an oxygen concentration of 50 ppm or less) at a high temperature (for example, about 200° C. to about 300° C.) may be performed.

Figure 4:
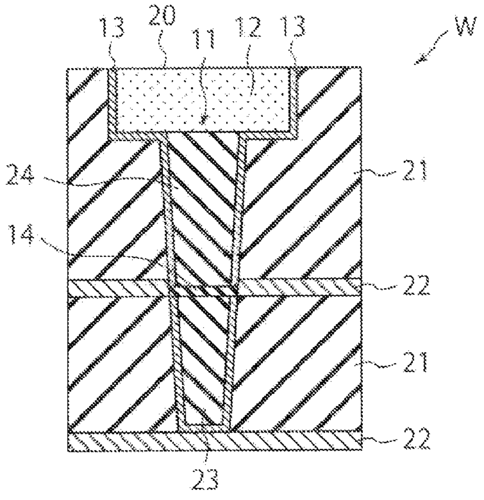
FIG. 4 is a diagram illustrating an example of the part of the cross section of the substrate to describe the example flow of the electroless plating processing.

Then, in the state that the metal ions 15 are attached to the diffusion barrier layer 13, an electroless plating liquid 20 is supplied into the via hole 11 (see FIG. 3), and a metal (copper in the present exemplary embodiment) constituting a second metal wiring 24 is precipitated in the via hole 11 (see FIG. 4). That is, the cap layer 14 exposed at the bottom of the via hole 11 acts as a catalytic nucleus, and the copper precipitated by the electroless plating processing is selectively deposited on the cap layer 14. Meanwhile, the metal ions 15 attached on the diffusion barrier layer 13 have the concentration that does not cause the precipitation of the copper even when the electroless plating liquid 20 comes into contact with them. For this reason, in the process in which the electroless plating liquid 20 is collected in the via hole 11 to precipitate the copper in the via hole 11, the plating metal (copper) is grown from the bottom of the via hole 11 while it is not grown from the diffusion barrier layer 13. Therefore, the plating metal is gradually deposited in the via hole 11 starting from the bottom toward the top to thereby form the second metal wiring 24.

In general, the electroless plating processing of depositing the plating metal from the bottom in the via hole 11 has advantage in that the plating metal can be selectively deposited in the via hole 11 while effectively suppressing formation of voids (cavities). Meanwhile, when the diffusion barrier layer 13 forming a surface (especially, a side surface) of the via hole 11 is not specially processed, the plating metal in the via hole 11 is not connected to the diffusion barrier layer 13 but merely in contact with it. For this reason, the adhesion between the plating metal in the via hole 11 and the diffusion barrier layer 13 is not necessarily good. For example, in an environment accompanied by temperature variations, there is a concern that problems such as stress migration may be caused by the poor adhesion between the plating metal and the diffusion barrier layer 13.

Meanwhile, according to the present exemplary embodiment, the electroless plating processing in the via hole 11 is performed in the state that the metal ions 15 with the low concentration not causing the precipitation of the metal even when the electroless plating liquid comes into contact with them is attached to the diffusion barrier layer 13. The metal ions 15 of the low concentration adhering to the diffusion barrier layer 13 exert an anchor effect, and act as a binder to strengthen the adhesion between the plating metal in the via hole 11 and the diffusion barrier layer 13. For this reason, the plating metal in the via hole 11 is relatively firmly fixed to the diffusion barrier layer 13, and even if it is placed in an environment accompanied by a big temperature change, the poor adhesion to the diffusion barrier layer 13 may not be caused. Therefore, according to the present exemplary embodiment, the plating metal can be deposited from the bottom of the via hole 11 to suppress the formation of the voids, while allowing the plating metal to be adhered well to the diffusion barrier layer 13 not to cause the problems such as the stress migration.

Any processing not mentioned above may be performed before, during, or after the above-described substrate liquid processing method. For example, after the second metal wiring 24 (refer to FIG. 4) is buried in the via hole 11, the metal wiring is also buried in the trench 12 by the electroless plating processing or another processing. In addition, before and after the above-described substrate liquid processing method, a washing processing, a rinsing processing, and/or a drying processing for the substrate W (especially, a processing surface thereof) may be performed. Further, by heating the substrate W after precipitating the plating metal in the via hole 11 (for example, before or after the metal wiring is buried in the trench 12), the strength of the bonding between the second metal wiring 24 and the diffusion barrier layer 13 can be enhanced.

Next, an example of a substrate liquid processing apparatus configured to perform the substrate liquid processing method described above will be discussed.

Figure 5:
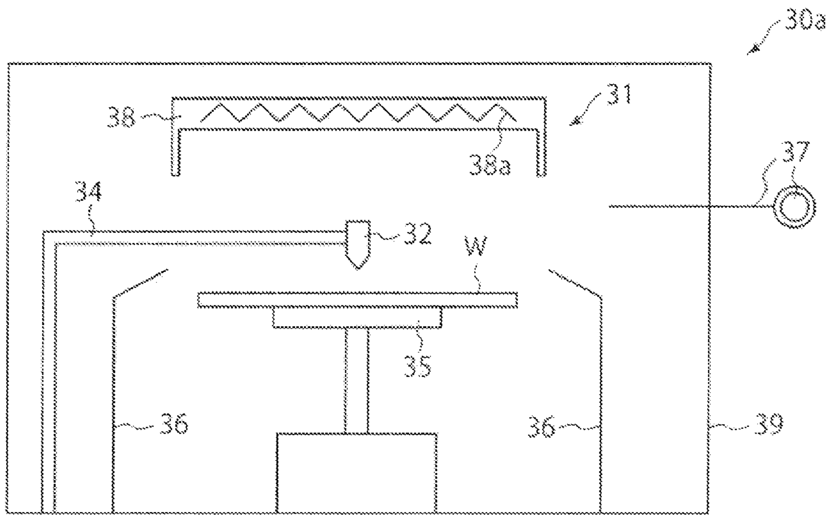
FIG. 5 is a diagram schematically illustrating an example of an ion processing unit equipped with a metal ion applying unit.

FIG. 5 is a diagram illustrating an example of an ion processing unit 30*a* equipped with a metal ion applying unit 31. A specific configuration of individual components of the metal ion applying unit 31 is not particularly limited. FIG. 5 shows the individual components of the metal ion applying unit 31 in a simplified manner.

The metal ion applying unit 31 applies the metal ions 15 to the substrate W to attach the metal ions 15 having the "concentration not causing the precipitation of the metal even when the electroless plating liquid 20 comes into contact with the diffusion barrier layer 13" to the diffusion barrier layer 13. The metal ion applying unit 31 in the shown example includes a first discharge unit 32 configured to be movable by a first discharge driving unit 34, a first substrate holder 35, a first cup structure 36, a first inert gas supply 37, and a first heating device 38 equipped with a first heater 38*a*. Specifically, the first discharge unit 32, the first discharge driving unit 34, the first substrate holder 35, the first cup structure 36, and the first heating device 38 are provided inside a first processing chamber 39.

The first substrate holder 35 holds the substrate W rotatably. The first substrate holder 35 in the shown example attracts and holds a rear surface of the substrate W. However, the specific way how to hold the substrate W is not particularly limited. The first discharge unit 32 has, at least, a nozzle (not shown) for discharging the liquid (the metal ion-containing liquid) containing the metal ions 15. The first discharge unit 32 may also be configured to discharge other fluids. For example, a cleaning liquid for cleaning the substrate W or a rinse liquid for washing the substrate W may be discharged from the first discharge unit 32. When discharging multiple kinds of fluids (for example, multiple kinds of liquids) from the first discharge unit 32, two or more kinds of fluids may be discharged from a common nozzle, or the first discharge unit 32 may have two or more nozzles configured to discharge different kinds of fluids.

The first cup structure 36 having a ring shape in a plan view is configured to surround the substrate W held by the first substrate holder 35. The first cup structure 36 serves to receive the liquid scattered from the substrate W and guide the received liquid into a drain duct (not shown), or serves to rectify a flow of a gas around the substrate W to suppress diffusion of the gas. A specific configuration of the first cup structure 36 is not particularly limited. For example, the first cup structure 36 may have a cup mainly for guiding the liquid and a cup mainly for rectifying the flow of the gas separately.

The first heating device 38 is configured to be moved up and down by a non-illustrated driving mechanism. By way of example, when heating the substrate W, the first heating device 38 is disposed at a lower position to be located close to the substrate W. Meanwhile, when the substrate W is not heated, the first heating device 38 is disposed at an upper position to be distanced away from the substrate W. In a period during which the first discharge unit 32 is positioned above the substrate W, the first heating device 38 is disposed at a height position where it does not come into contact with and collide with the first discharge unit 32 and the first discharge driving unit 34.

The first inert gas supply 37 supplies an inert gas (for example, nitrogen) into the first processing chamber 39. Since the first processing chamber 39 is basically sealed, exterior air does not enter the first processing chamber 39. The first processing chamber 39 does not necessarily have to be completely sealed but just needs to be sealed enough to effectively suppress the exterior air from reaching the inside (particularly, reaching the vicinity of the substrate W held by the first substrate holder 35).

The metal ions 15 are applied to the substrate W by the ion processing unit 30*a* having the above-described configuration. For example, the substrate W is loaded into the first processing chamber 39 of the ion processing unit 30*a*, and a liquid including the metal ions 15 is discharged from the first discharge unit 32 toward the processing surface (top surface) of the substrate W in the state that the substrate W is held by the first substrate holder 35. At this time, the liquid including the metal ions 15 may be applied to the processing surface of the substrate W in the state that the substrate W is being rotated by the first substrate holder 35.

After the liquid including the metal ions 15 is applied to the entire processing surface of the substrate W, a rinse liquid may be discharged from the first discharge unit 32 to supply the rinse liquid onto the processing surface of the substrate W. In this case, a rinsing processing is performed so that the "metal ions 15 having the concentration not causing the precipitation of the metal even when the electroless plating liquid 20 comes into contact with them" remain on the processing surface (particularly, on the diffusion barrier layer 13 defining the via hole 11 (recess)) of the substrate W. Specifically, it is possible to adjust the concentration of the metal ions 15 remaining on the processing surface of the substrate W by changing the amount of the application of the rinse liquid onto the substrate W, the time period of the application of the rinse liquid, and/or the number of rotations of the substrate W. When the liquid containing the "metal ions 15 having the concentration not causing the precipitation of the metal even when the electroless plating liquid 20 comes into contact with them" is applied to the substrate W from the beginning, the rinsing processing for washing away the metal ions 15 from the substrate W does not need to be performed.

Then, in the state that the "metal ions 15 having the concentration not causing the precipitation of the metal even when the electroless plating liquid 20 comes into contact with them" are attached to the processing surface of the substrate W, a drying processing and/or a heat processing for the processing surface of the substrate W is performed. The drying processing for the substrate W may be performed by rotating the substrate W at a high speed by the first substrate holder 35, or by spraying a gas (for example, an inert gas from the first inert gas supply 37) onto the substrate W. Further, the drying processing and the heat processing of the substrate W may be performed simultaneously. For example, by disposing the first heating device 38 at the lower position to bring the first heater 38*a* in an exothermic state close to the processing surface of the substrate W, it is possible to perform the drying processing and the heat processing of the substrate W at the same time. In particular, by heating the substrate W at a high temperature while adjusting the inside of the first processing chamber 39 (particularly, the vicinity of the substrate W) into a low oxygen concentration atmosphere, the adhesion of the metal ions 15 to the substrate W (particularly, the diffusion barrier layer 13) can be effectively increased.

As described above, the substrate W with the 'metal ions 15 having the concentration not causing the precipitation of the metal even when the electroless plating liquid 20 comes into contact with them" attached to the diffusion barrier layer 13 is transferred from the ion processing unit 30*a* into a plating unit.

Figure 6:
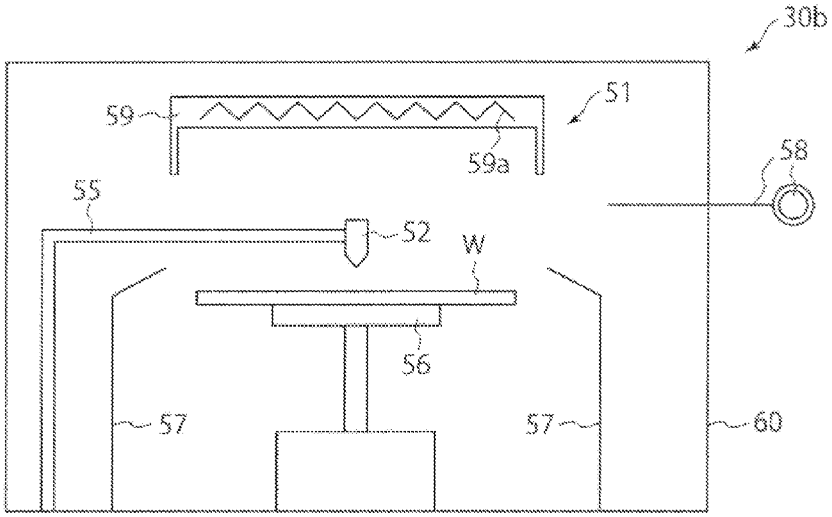
FIG. 6 is a diagram schematically illustrating an example of a plating unit equipped with an electroless plating liquid applying unit.

FIG. 6 is a diagram illustrating an example of the plating unit 30*b* including an electroless plating liquid applying unit 51. A specific configuration of individual components of the electroless plating liquid applying unit 51 is not particularly limited, and FIG. 6 illustrates the individual components of the electroless plating liquid applying unit 51 in a simplified manner.

The electroless plating liquid applying unit 51 provided in the plating unit 30*b* supplies the electroless plating liquid 20 into the via hole 11 of the substrate W in which the metal ions 15 are attached to the diffusion barrier layer 13, thus allowing the metal to be precipitated in the via hole 11. The electroless plating liquid applying unit 51 in the shown example includes a second discharge unit 52 configured to be movable by a second discharge driving unit 55, a second substrate holder 56, a second cup structure 57, a second inert gas supply 58, and a second heating device 59 equipped with a second heater 59*a*. The second discharge unit 52, the second discharge driving unit 55, the second substrate holder 56, the second cup structure 57, and the second heating device 59 are installed inside a second processing chamber 60.

The second substrate holder 56 is configured to hold the substrate W rotatably. The configuration of the second substrate holder 56 is not particularly limited. The second substrate holder 56 may have the same configuration as the first substrate holder 35 (see FIG. 5), or may have a different configuration from the first substrate holder 35.

The second discharge unit 52 has, at least, a nozzle (not shown) for discharging the electroless plating liquid 20. The second discharge unit 52 may be configured to discharge another fluid. For example, a cleaning liquid for cleaning the substrate W or a rinse liquid for washing the substrate W may be discharged from the second discharge unit 52. When discharging multiple kinds of fluids (for example, multiple kinds of liquids) from the second discharge unit 52, two or more kinds of fluids may be discharged from a common nozzle, or the second discharge unit 52 may have two or more nozzles configured to discharge different kinds of fluids.

The second cup structure 57 serves to receive the liquid scattered from the substrate W and guide the received liquid into a drain duct (not shown), or serves to rectify a flow of a gas around the substrate W to suppress diffusion of the gas. A specific configuration of the second cup structure 57 is not particularly limited. For example, the second cup structure 57 of the electroless plating liquid applying unit 51 typically has a ring shape in a plan view, and configured to surround the substrate W held by the second substrate holder 56.

The second inert gas supply unit 58 supplies an inert gas (for example, nitrogen) into the second processing chamber 60. The second heating device 59 is configured to be moved up and down by a non-illustrated driving device. In a period during which the second discharge unit 52 is positioned above the substrate W, the second heating device 59 is disposed at a height position where it comes not come into contact with and collide with the second discharge unit 52 and the second discharge driving unit 55.

By the plating unit 30*b* having the above-described configuration, the electroless plating liquid 20 is applied to the substrate W, and the plating metal (copper in the present exemplary embodiment) is buried in each via hole 11. For example, the substrate W is loaded into the second processing chamber 60, and the electroless plating liquid 20 is discharged from the second discharge unit 52 toward the processing surface (top surface) of the substrate W in the state that the substrate W is held by the second substrate holder 56. At this time, the electroless plating liquid 20 may be applied onto the processing surface W of the substrate W in the state that the substrate W is being rotated by the second substrate holder 56.

The state in which the electroless plating liquid 20 is applied on the entire processing surface of the substrate W is maintained, and the plating metal (copper in the present exemplary embodiment) is deposited and grown in each via hole 11. As a result, each via hole 11 is filled with the plating metal, and the second metal wiring 24 is formed in the via hole 11. At this time, the electroless plating liquid 20 on the substrate W may be heated by the second heating device 59 to accelerate the deposition of the plating metal. By way of example, it is possible to heat the electroless plating liquid 20 on the substrate W by disposing the second heating device 59 at a lower position to bring the second heater 59*a* in an exothermic state close to the processing surface of the substrate W.

Thereafter, the metal (wiring) is buried in the trench 12 as well. The metal buried in the trench 12 is physically and electrically connected to the second metal wiring 24 in the via hole 11. The filling of the metal into the trench 12 may be performed by any method. As an example, the plating metal may be filled in the trench 12 by a commonly known electroless plating method or electrolytic plating method.

As described above, the substrate W having the via hole 11 and the trench 12 filled with the metal is then transferred from the plating unit 30*b* into a heat treating unit. Further, the substrate W having the via hole 11 and the trench 12 filled with the metal may be subjected to a rinsing processing, a drying processing, and other processings in the plating unit 30*b* before being sent to the heat treating unit.

Figure 7:
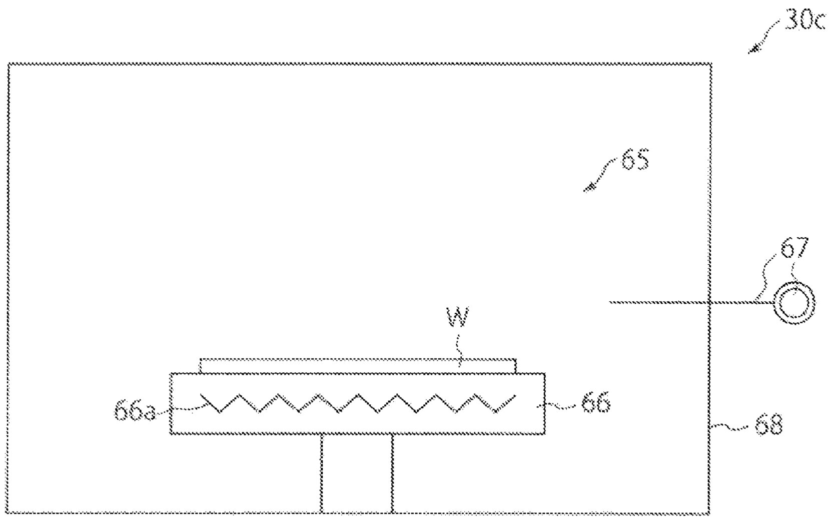
FIG. 7 is a diagram schematically illustrating an example of a heat treating unit equipped with a heating unit.

FIG. 7 is a diagram illustrating an example of a heat treating unit 30*c* including a heating unit 65. A specific configuration of individual components of the heating unit 65 is not limited, and FIG. 7 illustrates the individual components of the heating unit 65 in a simplified manner.

The heating unit 65 heats the substrate W after the metal is precipitated in the recess (particularly, the via hole 11) of the substrate W, thus enhancing the strength of bonding between the surface of the recess (particularly, the diffusion barrier layer 13) of the substrate W and the metal wiring (particularly, the second metal wiring 24) of the substrate W. The heating unit 65 in the shown example includes a third heating device 66 equipped with a third heater 66*a*, and a third inert gas supply 67. The third heating device 66 is provided inside a third processing chamber 68. The third inert gas supply 67 supplies an inert gas into the third processing chamber 68.

By heating the substrate W to a high temperature while adjusting the inside of the third processing chamber 68 (particularly, the vicinity of the substrate W) to a low oxygen concentration atmosphere, the strength of the bonding between the surface of the recess of the substrate W and the metal wiring may be enhanced. Since the third processing chamber 68 is basically sealed, exterior air does not enter the third processing chamber 68. However, the third processing chamber 68 does not necessarily need to be completely sealed but just needs to be sealed enough to effectively suppress the exterior air from reaching the inside of the third processing chamber 68.

Figure 8:
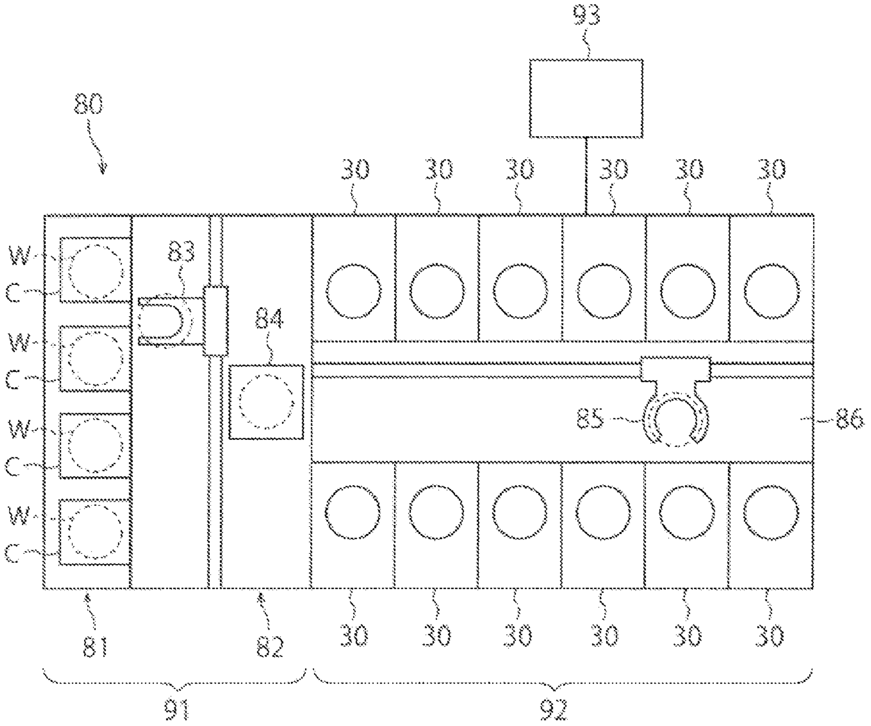
FIG. 8 is a diagram schematically illustrating an example of a processing system.

The series of processings performed in the ion processing unit 30*a* (see FIG. 5), the plating unit 30*b* (see FIG. 6), and the heat treating unit 30*c* (see FIG. 7) described above may be performed in, for example, a processing system 80 schematically illustrated in FIG. 8.

The processing system 80 shown in FIG. 8 includes a carry-in/out station 91 and a processing station 92. The carry-in/out station 91 includes a placing section 81 equipped with a plurality of carriers C, and a transfer section 82 including a first transfer device 83 and a delivery unit 84. Each carrier C accommodates therein a plurality of substrates W horizontally. The processing station 92 is provided with a plurality of processing units 30 arranged on both sides of a transfer path 86, and a second transfer device 85 configured to be moved back and forth on the transfer path 86. At least some of the plurality of processing units 30 provided in the processing station 92 are configured to perform at least one of the series of processings described above. That is, each of the ion processing unit 30*a* (see FIG. 5), the plating unit 30*b* (see FIG. 6), and the heat treating unit 30*c* (see FIG. 7) is configured by one or more processing units 30 shown in FIG. 8.

The substrate W is taken out from the carrier C and loaded on the delivery unit 84 by the first transfer device 83, and then taken out from the delivery unit 84 by the second transfer device 85. The substrate W is sequentially carried into the processing units 30 corresponding to the series of processings described above by the second transfer device 85, and is then taken out from each processing unit 30 after being subjected to a predetermined processing in each processing unit 30. That is, the substrate W is first carried into the processing unit 30 corresponding to the ion processing unit 30*a* by the second transfer device 85 to be subjected to a metal ion applying processing. Thereafter, the substrate W is carried into the processing unit 30 corresponding to the plating unit 30*b* by the second transfer device 85 to be subjected to a plating metal deposition processing using the electroless plating liquid 20. Then, the substrate W is carried into the processing unit 30 corresponding to the heat treating unit 30*c* by the second transfer device 85, and is subjected to a plating metal heating processing. The substrate W that has undergone these series of processings is loaded on the delivery unit 84 by the second transfer device 85, and then returned back into to the carrier C of the placing section 81 by the first transfer device 83.

The processing system 80 includes a control device 93. The control device 93 is implemented by, for example, a computer, and includes a controller and a storage. The storage of the control device 93 stores therein programs and data for various processings performed in the processing system 80. The controller of the control device 93 controls the various devices of the processing system 80 to perform the various processings by properly reading and executing the programs stored in the storage. Thus, as the control device 93 controls operations of the first transfer device 83, the second transfer device 85, and the various devices provided in the ion processing unit 30*a*, the plating unit 30*b* and the heat treating unit 30*c* described above, the above-described series of processings are performed.

The programs and data stored in the storage of the control device 93 may be recorded in a computer-readable recording medium and installed from the recording medium to the storage. The computer-readable recording medium may include, by way of example, but not limitation, a hard disk (HD), a flexible disk (FD), a compact disk (CD), a magnet optical disk (MO), a memory card, and so forth.

Modification Example

In the above-described exemplary embodiment, the metal ion applying processing, the metal deposition processing, and the plating metal heating processing are respectively performed in the different processing units 30 (i.e., the ion processing unit 30*a*, the plating unit 30*b*, and the heat treating unit 30*c*). However, some or all of these series of processings may be performed in a common processing unit 30 (i.e., within the same processing chamber).

For example, by providing the "nozzle for discharging the liquid containing the metal ions 15" and the "nozzle for discharging the electroless plating liquid 20" at a common discharge unit, the above-described metal ion applying processing and metal deposition processing may be performed in the single processing unit 30. In addition, by providing the "nozzle discharging the electroless plating liquid 20" and the "third heating device 66" in a common processing chamber, it is possible to perform the metal deposition processing and the plating metal heating processing in a single processing unit 30.

Further, although the first heating device 38 shown in FIG. 5 and the second heating device 59 shown in FIG. 6 are configured to be movable up and down, these first and second heating devices 38 and 59 may be fixed. For example, the first heater 38*a* may be embedded in the first substrate holder 35 (see FIG. 5), and the first substrate holder 35 may function as the first heating device 38. Likewise, the second heater 59*a* may be embedded in the second substrate holder 56 (see FIG. 6), and the second substrate holder 56 may function as the second heating device 59. Meanwhile, although the third heating device 66 shown in FIG. 7 is fixed, the third heating device 66 may be configured to be movable. For example, the third heating device 66 may be configured to be movable up and down, the same as the first heating device 38 shown in FIG. 5. Additionally, when the metal ion applying unit 31 (see FIG. 5) does not perform a heating processing, installation of the first heating device 38 therein is not necessary. Likewise, when the electroless plating liquid applying unit 51 (see FIG. 6) does not perform a heating processing, installation of the second heating device 59 therein is unnecessary.

Further, on/off operations of the first heater 38*a* (see FIG. 5), the second heater 59*a* (see FIG. 6), and the third heater 66*a* (see FIG. 7), or heat generation amounts thereof may be controlled by the control device 93 (see FIG. 8).

Furthermore, although the cap layer 14 is provided at the bottom of the via hole 11 in the exemplary embodiment shown in FIG. 1 to FIG. 4, the cap layer 14 does not need to be provided. In this case, by exposing, at the bottom of the via hole 11, a wiring (for example, the first metal wiring 23) serving as a catalytic nucleus of the plating metal precipitated in the via hole 11, it is possible to deposit the plating metal from the bottom in the via hole 11.

It should be noted that the exemplary embodiments and the modification examples disclosed in the present specification are illustrative in all aspects and are not anyway limiting. The above-described exemplary embodiments and modification examples may be omitted, replaced and modified in various ways without departing from the scope and the spirit of claims. By way of example, the exemplary embodiments and the modification examples described above may be combined with each other, or an exemplary embodiment other than those described in the preset disclosure may be combined with the above-described exemplary embodiments or modification examples.

Furthermore, a technical category for embodying the above-described technical concept is not particularly limited. By way of example, the above-described substrate liquid processing apparatus may be applied to another apparatus. Moreover, the above-described technical concept may be embodied by a computer-executable program for executing one or multiple sequences (processes) included in the above-described substrate liquid processing method on a computer. Further, the above-described technical concept may be embodied by a computer-readable non-transitory recording medium in which such a computer-executable program is stored.

I claim:

1. A substrate liquid processing method, comprising:

preparing a substrate having a recess, a diffusion barrier layer defining the recess, and a wiring exposed at a bottom of the recess;

attaching metal ions to the diffusion barrier layer; and precipitating metal in the recess by supplying an electroless plating liquid into the recess in a state that the metal ions are attached to the diffusion barrier layer, wherein the attaching metal ions to the diffusion barrier layer comprises:

applying a liquid containing the metal ions on an exposed surface of the diffusion barrier layer; and supplying, after applying the liquid containing the metal ions and before supplying the electroless plating liquid into the recess of the substrate, a rinse liquid to a surface of the diffusion barrier layer to which the metal ions are attached, thereby washing away a portion of the metal ions that adhere to the diffusion barrier layer, such that, in the precipitating of the metal in the recess, the metal is grown from the wiring exposed at the bottom of the recess, and the metal is not allowed to be grown from the diffusion barrier layer.

2. The substrate liquid processing method of claim 1, wherein the metal ions include an ion of at least one of palladium, ruthenium or platinum.

3. The substrate liquid processing method of claim 1, wherein the attaching of the metal ions to the diffusion barrier layer comprises applying a rinse liquid to the diffusion barrier layer to which the metal ions are attached.

4. The substrate liquid processing method of claim 1, wherein the attaching of the metal ions to the diffusion barrier layer comprises heating the diffusion barrier layer to which the metal ions are attached.

5. The substrate liquid processing method of claim 1, further comprising:

heating the substrate after the precipitating of the metal in the recess.

6. A substrate liquid processing apparatus, comprising:

a metal ion applying unit configured to apply metal ions to a substrate having a recess, a diffusion barrier layer defining the recess, and a wiring exposed at a bottom of the recess, to attach the metal ions to the diffusion barrier layer; and an electroless plating liquid applying unit configured to supply an electroless plating liquid into the recess of the substrate, in which the metal ions are attached to the diffusion barrier layer, to precipitate metal in the recess, wherein the metal ion applying unit is further configured to apply a liquid containing the metal ions on an exposed surface of the diffusion barrier layer, and, after applying the liquid containing the metal ions and before supplying the electroless plating liquid into the recess of the substrate, to supply a rinse liquid to a surface of the diffusion barrier layer to which the metal ions are attached, thereby washing away a portion of the metal ions that adhere to the diffusion barrier layer, such that, when the metal is being precipitated in the recess, the metal is grown from the wiring exposed at the bottom of the recess, and the metal is not allowed to be grown from the diffusion barrier layer.

* * * * *